(12) United States Patent
Coffman

(10) Patent No.: US 6,451,627 B1
(45) Date of Patent: Sep. 17, 2002

(54) SEMICONDUCTOR DEVICE AND PROCESS FOR MANUFACTURING AND PACKAGING A SEMICONDUCTOR DEVICE

(75) Inventor: Samuel L. Coffman, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/391,879

(22) Filed: Sep. 7, 1999

(51) Int. Cl.[7] .......................... H01L 21/48; H01R 43/00
(52) U.S. Cl. ........................ 438/111; 438/112; 438/118; 438/121; 438/123; 438/124; 438/127; 29/827; 29/841
(58) Field of Search .................. 438/110, 111, 438/112, 113, 114, 115, 118, 123, 124, 126, 612, 127, 691, 106, 121; 29/827, 841; 257/692, 693, 734, 784, 787

(56) References Cited

U.S. PATENT DOCUMENTS

| | | | |
|---|---|---|---|
| 5,900,676 A | * 5/1999 | Kweon et al. | 257/787 |
| 6,001,671 A | * 12/1999 | Fjelstad | 438/112 |
| 6,238,952 B1 | * 5/2001 | Lin | 438/110 |
| 6,261,864 B1 | * 7/2001 | Jung et al. | 438/106 |
| 6,306,685 B1 | * 10/2001 | Liu et al. | 438/121 |
| 6,333,252 B1 | * 12/2001 | Jung et al. | 438/612 |
| 6,342,730 B1 | * 1/2002 | Jung et al. | 257/692 |

FOREIGN PATENT DOCUMENTS

| | | | |
|---|---|---|---|
| EP | 0773584 | 5/1997 | .......... H01L/23/31 |
| JP | 3-94430 | * 4/1991 | |
| JP | 3-94431 | * 4/1991 | |

* cited by examiner

Primary Examiner—David L. Talbott
Assistant Examiner—Alonzo Chambliss
(74) Attorney, Agent, or Firm—Rennie William Dover

(57) ABSTRACT

A process for manufacturing a semiconductor device (70) using selective plating and etching to form the packaging for such device. A flat sheet (20) of conductive material is selectively plated with a conductive etch resistant material to form a plurality of die attach areas (22) on one side (23) of the sheet (20) and to define die contact (24) and lead contact (26) areas on the opposite side (27) of the sheet. Mold locks (34) which also serve as interconnect bonding areas are selectively plated on the side (23) of the sheet in association with each of the die attach areas (22). Semiconductor die (40) are attached to each of the die attach areas (22) and bonded (42) to the tops of the mold locks (34). A unitary molded resin housing (50) is formed overlying all of the semiconductor device die (40). The underside (27) of the conductive sheet (20) is selectively etched using the plated etch resistant material (24), (26) as an etch mask to form isolated die contact areas (60) and lead contact areas (62). The unitary housing (50) can then be sawed to separate the plurality of the semiconductor device die into a plurality of individual device structures (70).

30 Claims, 4 Drawing Sheets

SEMICONDUCTOR DEVICE AND PROCESS FOR MANUFACTURING AND PACKAGING A SEMICONDUCTOR DEVICE

BACKGROUND OF THE INVENTION

This invention relates, in general, to a semiconductor device and to a process for manufacturing a semiconductor device and, more specifically, to a semiconductor device and to a process for manufacturing and packaging a semiconductor device that does not require a customized leadframe pre-tailored to a specific device.

A semiconductor device is fabricated by mounting a semiconductor device die in a supportive, protective package. The word "die" will be used herein, in conformance with usual semiconductor industry usage, to include both the singular and the plural. The package serves a number of different functions including providing physical protection for the device and providing electrical access or connection to the semiconductor device die. In a conventional process the semiconductor device die is mounted on a prefabricated leadframe. After forming electrical connections between the device die and the leadframe leads, the die and its associated leads are encapsulated in a molded plastic housing. Such a conventional process for packaging a semiconductor device die has a number of disadvantages or drawbacks. Foremost among the disadvantages is the high cost of the packaging which results, in part, from the fact that each different device type may require a different leadframe. This is especially true for those applications in which the customer requires a custom lead configuration. The leadframe upon which the semiconductor device die is mounted is usually stamped from a sheet of metal and is then plated with gold or other metals that help to insure solderability. Each different leadframe configuration requires an expensive stamping tool which has the disadvantages of being very high in cost and requiring long lead times.

Conventional semiconductor packages are also relatively large in size. This is true even of miniaturized packages such as the TSSOP (Thin, Shrink, Small Outline Package). The large packages, besides consuming large amounts of valuable space within today's miniaturized electronic equipment, contribute high package inductance that impairs RF performance because of the relatively long package leads. In addition, many of the present day packages have poor thermal characteristics so that a packaged device is not able to adequately dissipate large amounts of heat generated during device operation.

In view of the foregoing problems with conventional packaging, a need exists for a process for manufacturing a packaged device that is small, does not require unique leadframes, provides good heat dissipation, has low lead inductance, is inexpensive, and is capable of short turnaround times to accommodate new designs.

DETAILED DESCRIPTION OF THE DRAWINGS

In accordance with the invention, a semiconductor device and a process for manufacturing a semiconductor device are provided in which a customized leadframe is formed by selective etching during the device processing rather than by pre-forming a leadframe. The process uses a sacrificial conductive sheet that is etched during the device fabrication process to form customized package mounting, heatsink and contact areas. Only two or three customized photolithography masks, depending on the embodiment, are needed to produce the device.

Figure 1:
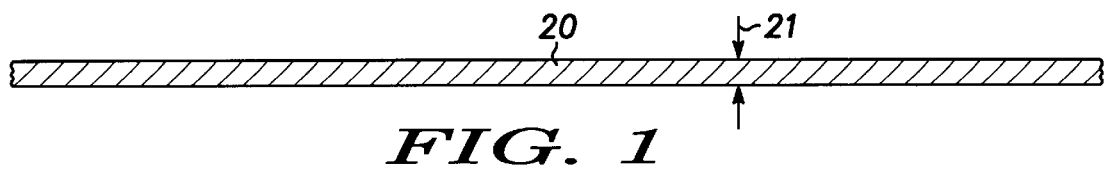
FIGS. 1–8 schematically illustrate, in cross-section, a sequence of process steps in accordance with one embodiment of the invention.

FIGS. 1–8 illustrate schematically, in cross-section, process steps in accordance with one embodiment of the present invention. The process begins, as illustrated in FIG. 1, with a sheet of conductive material 20. In a preferred embodiment, conductive sheet 20 is a sheet of copper or an alloy of copper having a thickness 21 of about 75 microns–250 microns and preferably a thickness of about 125 microns. Copper or a copper alloy are preferred materials for sheet 20 because copper is relatively inexpensive, can be etched easily, and is a good conductor, both thermally and electrically. The width and length of sheet 20 can be selected for a particular application, but can be, for example, about 4–10 (centimeters) cm in width and about 8–20 cm in length.

Figure 2:
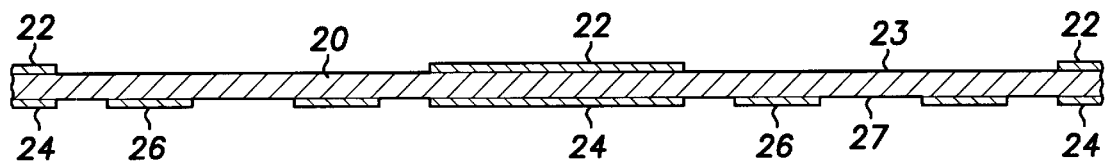

The process continues, as illustrated in FIG. 2, by forming a plurality of die attach pads or areas 22 on a surface 23 of sheet 20. One die attach pad is formed for each device that is to be fabricated. Preferably the die attach pads are positioned in a regular array over at least the whole of the central portion of surface 23 of sheet 20. A plurality of device die contacts 24 and a plurality of device lead contacts 26 are formed on a surface 27 of sheet 20. Die contacts 24 are preferably defined to be in alignment with die attach pads 22. Die attach pads 22 and contacts 24 and 26 can be formed by selective plating. The selective plating can be achieved by applying a layer of photo-imageable resist to each side of sheet 20 and by selectively exposing the resist using commonly known photolithographic techniques. The resist layer may be exposed, in a known manner, by shining radiation of appropriate wavelength through a patterned mask to replicate the mask pattern in the resist layer.

The resultant patterned resist is then used as a plating mask and die pads 22 and contacts 24 and 26 are selectively plated onto those areas on sheet 20 that are not covered by the patterned resist. The plating can be accomplished by electrolytic plating, electroless plating, or as otherwise desired. The plated areas, in the preferred embodiment, are plated with sequential layers of nickel and palladium, nickel and gold, or nickel and silver. Other plated metal systems can also be used. The preferred metal systems all have the properties of good adherence to conductive sheet 20, compatibility with materials subsequently used to attach a semiconductor die to each of the die attach pads 22, and the ability of the plated material on device die contacts 24 and device lead contacts 26 to act as an etch mask in a subsequent processing step. Additionally, it is preferred that a material be used for plated contacts 24 and 26 that is compatible with solder or other materials used to attach the device to a circuit board during the intended use of the device.

Figure 3:
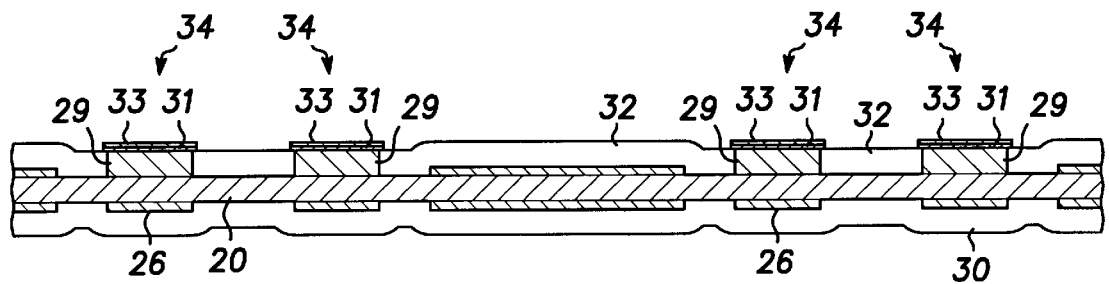

The process continues, in accordance with a preferred embodiment of the invention, by applying a photo-imageable resist layer 30 overlying surface 27 of sheet 20 and a photo-imageable resist layer 32 overlying surface 23 of conductive sheet 20. Layer 32 is photolithographically patterned as illustrated in FIG. 3. Openings are provided in resist layer 32 in alignment with device lead contacts 26. Patterned resist layer 32 and unpatterned resist layer 30 are then used as plating masks. Mold locks 34 are formed by plating through the openings provided in patterned resist layer 32. Mold locks 34 are preferably formed by plating first with copper 29 and then with sequential layers of nickel 31 and palladium 33. Other capping layers can also be plated over the copper such as sequential layers of nickel and gold, nickel and silver, and the like. The sequential layers are selected to provide good adherence to the copper and to provide an outer surface that can be easily bonded to in a subsequent processing step. In a preferred embodiment the mold locks are plated to a thickness approximately equal to the thickness of the semiconductor device die that are to be subsequently mounted on die attach pads 22. As the plating proceeds to such a thickness, a portion of the plated material tends to "mushroom" and extend over the edge of the patterned resist layer 32. During the plating of mold locks 34, unpatterned resist layer 30 protects the surface 27 and contacts 24 and 26 and prevents plating thereon. It should be understood that the relative thicknesses of layers 29, 31, and 33 is not a limitation of the present invention. For example, layer 29 may extend above or below patterned resist layer 32.

Figure 4:
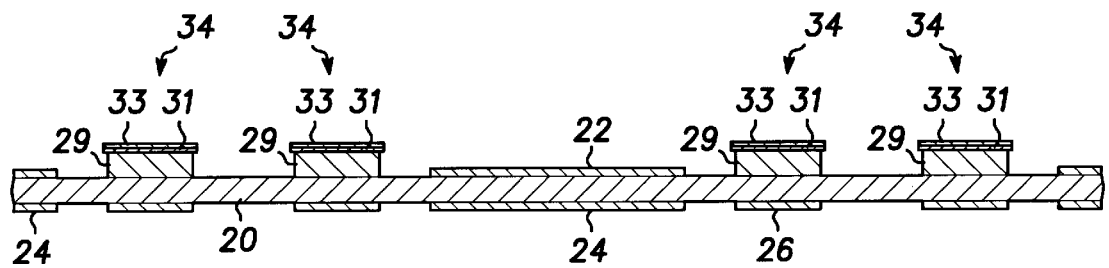

FIG. 4 illustrates the device fabrication process after the removal of resist layers 30 and 32. The mushrooming of mold locks 34 during plating causes them to be wider at the top than at the bottom where they join conductive sheet 20 at surface 23.

Figure 5:
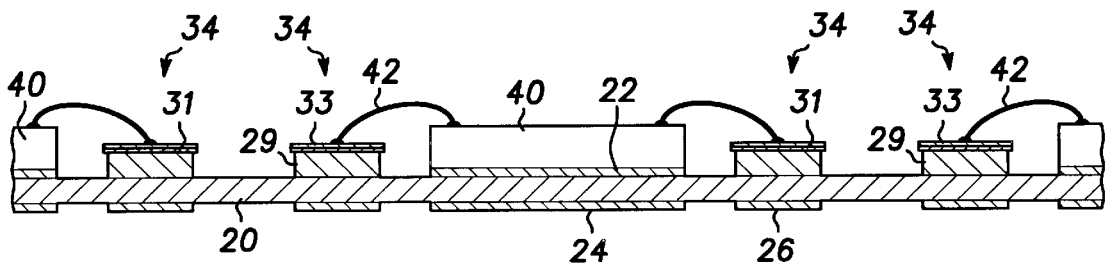

As illustrated in FIG. 5, the manufacturing process, in accordance with the invention, continues by the attachment of a semiconductor device die 40 to each of the plurality of die attach pads 22. Semiconductor device die 40 can be attached by solder, conductive epoxy, or the like depending on the device application and the intended thermal and electrical properties desired. The material used to form die attach pads 22 is selected to be compatible with the chosen die attach method. After attaching the semiconductor device die to the plurality of die attach pads, electrical interconnects 42 are formed extending between electrodes (not shown) on the surface of semiconductor device die 40 and the tops of mold locks 34. Mold locks 34 thus serve as mold locks, as explained below, and as interconnect bond areas. Interconnects 42 can be formed by wire bonding, TAB, or other conventional interconnect technologies used in the semiconductor industry. The material plated on the top surface of mold locks 34 is selected to facilitate the chosen interconnect bonding technique. Regardless of the particular technique chosen, the interconnect bonding is facilitated by having the top of mold locks 34 extending above the plane of sheet 20 and preferably close to the plane of the tops of semiconductor device die 40.

Figure 6:
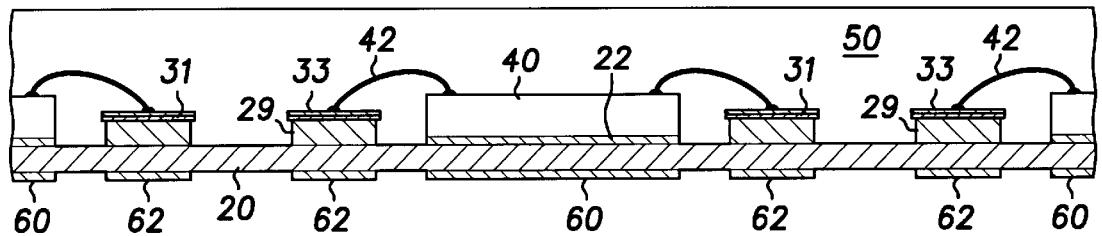

Following the attachment of semiconductor device die 40 to die attach pads 22 and the attachment of electrical interconnects 42, the devices are ready for encapsulation in a protective resin housing. In accordance with a preferred embodiment of the invention, all of the semiconductor device die and their respective interconnects and mold locks are encapsulated in a single, unitary molded resin housing 50 as illustrated in FIG. 6. The plurality of semiconductor device die can be encapsulated in a unitary molded resin housing by placing conductive sheet 20 and the attached die in a resin mold, closing the mold, and injecting the resin encapsulant into the mold cavity to form a unitary housing overlying the plurality of die. The mold cavity is sized to accommodate the predetermined size of sheet 20, regardless of the type of device die mounted on the sheet. By forming such a unitary molded resin housing and by using a standardized size for sheet 20 as the starting point for the process, the same mold can be used to accommodate a variety of different device types, device shapes, and device sizes. Alternatively, a customized mold can be used that provides an individual resin housing for each of the semiconductor device die and its associated interconnects. In accordance with yet another embodiment of the invention, each of the semiconductor device die can be encapsulated in a resin housing by glob top encapsulation.

Figure 7:
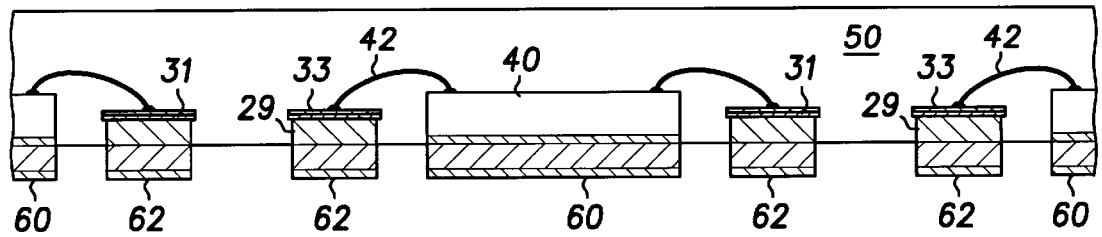

Now referring to FIG. 7, the conductive sheet 20 is selectively etched using the plated etch resistant material on device die contacts 24 and device lead contacts 26 as etch masks. Additionally, the unitary molded resin housing 50 acts as an etch mask and protects the semiconductor device die and their associated interconnects during the etching process. By etching completely through the thickness of conductive sheet 20, a plurality of isolated device die contacts 60 and a plurality of isolated device lead contacts 62 are formed. The enlarged "mushroom" top of mold locks 34 help to ensure that the individual device lead contacts are held securely within the molded resin housing.

Electrical contact to the back of semiconductor device die 40 can be made by contacting isolated device die contacts 60. Electrical contact to each of the device terminals on semiconductor device die 40 can be made by contacting the isolated device lead contacts 62. All of the semiconductor device die that were mounted on the original conductive sheet 20 can now be electrically tested by probing contacts 60 and 62. Because the individual devices are held in place by the unitary molded resin housing 50, the testing of the plurality of die can be easily automated and reject die can be inked or otherwise marked for later discard.

Figure 8:
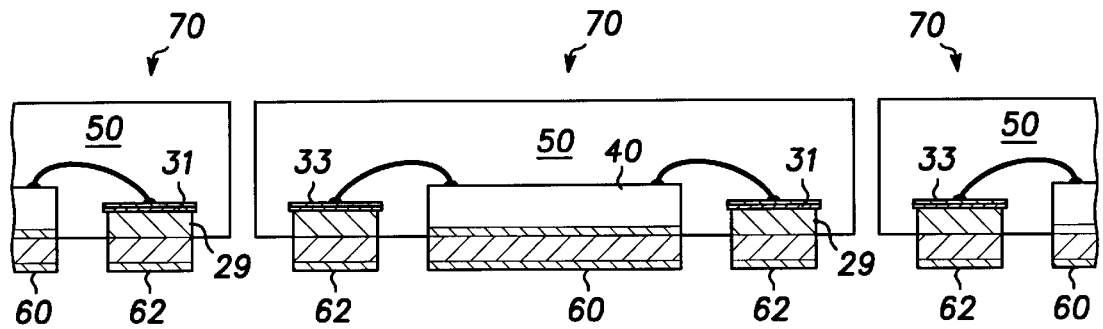

Following the etching of conductive sheet 20 to isolate the individual contacts 60 and 62 and the optional electrical testing of the semiconductor device die, the resin housing and the semiconductor device die encapsulated therein can be separated into individual devices using any conventional separation technique. In a preferred embodiment, the composite resin housing is sawed to singulate the individual semiconductor device die and their associated interconnects to create a plurality of separate finished semiconductor devices 70 as illustrated in FIG. 8.

The process, in accordance with the invention, for manufacturing devices 70 has a number of advantages. Devices 70 are small in size with the device lead contacts 62 located close to device die contact 60. A single encapsulation mold can be used for a wide variety of device configurations and sizes; a custom encapsulation mold is not required for each device type. Additionally, a custom leadframe and the tooling associated with custom leadframes are not needed for each different device configuration and size. Rather, the device lead contacts, device die contacts, and mold locks can be created using as few as three photolithography masks. The use of photolithography masks (as opposed to more conventional stamping equipment) to create the leadframe is further advantageous in that rapid turnaround is achievable for each different device package. Device 70 also provides heat sinking of the semiconductor device die 40 because the device die contact 60 can be soldered or otherwise attached to a circuit board or other equipment to facilitate the removal of heat from the operating device.

Figure 9:
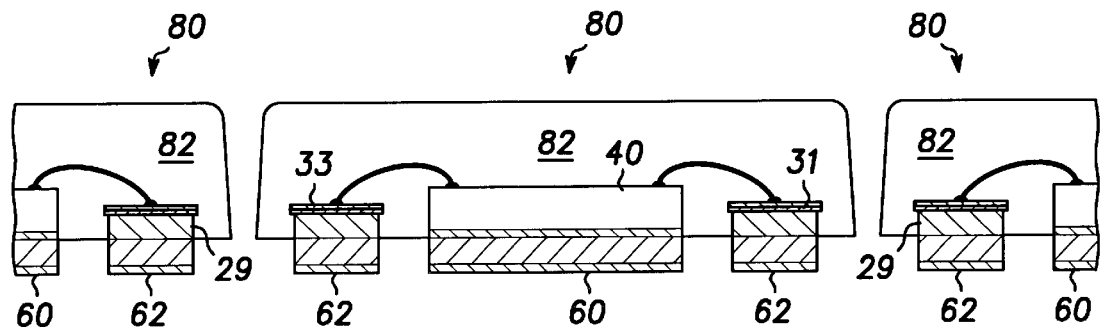
FIGS. 9–11 schematically illustrate, in cross-section, various device structures resulting from alternate embodiments of the invention.
Figure 10:
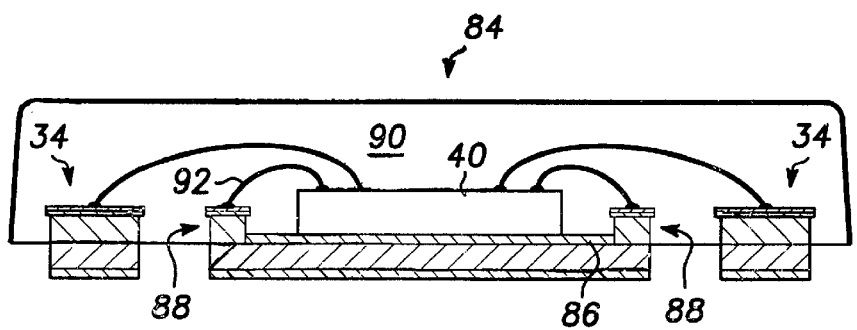
Figure 11:
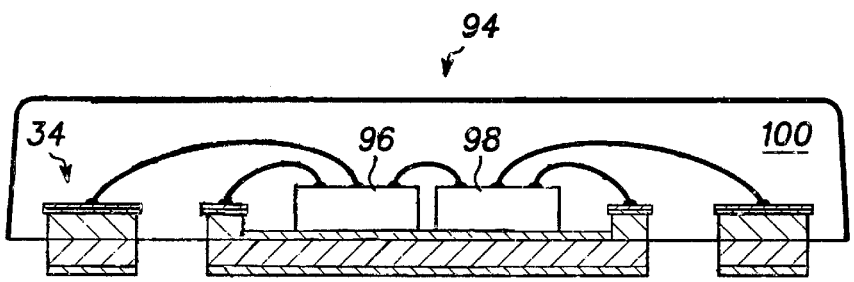

FIGS. 9–11 schematically illustrate, in cross section, various embodiments of the invention. Referring now to FIG. 9, device 80 is generally analogous to device 70 except that a molded resin housing 82 is individually configured for the semiconductor device instead of being molded along with a plurality of adjacent devices in a single unitary resin housing. That is, resin housing 82 is formed by using a resin mold having individual die cavities for each of the semiconductor devices. In each of the respective devices, 70 and 80, the device die contact 60 is approximately the same size as the semiconductor device die 40.

Semiconductor device 84, illustrated in FIG. 10, is similar to semiconductor device 70 and is manufactured in a similar manner except that device 84 has an extended device die contact 86 that is larger than semiconductor device die 40. The size of device die contact 86 is determined by the size of the plated die contact area metallization. Extended device die contact 86 provides improved thermal dissipation. In addition, semiconductor device 84 is provided with additional mold locks 88. The additional mold locks help to secure extended device die contact 86 in the molded resin 90 and also provide a convenient bonding area for a wirebond 92. The wirebond can be used, for example, to provide a ground contact on the top of the device die 40 in addition to a ground contact at the bottom surface of that die. The additional mold locks are formed by providing additional openings in the resist mask used in plating the mold locks 34.

Semiconductor device 94, illustrated in FIG. 11, may be manufactured by a process similar to that used to manufacture devices 70, 80, and 84. In addition, device 94 accommodates multiple semiconductor device die 96 and 98 within the same molded resin housing 100.

FIGS. 12–17 illustrate, in cross-section, process steps in accordance with a further embodiment of the invention. This embodiment of the invention is especially advantageous for the fabrication of power devices that include large semiconductor device die and that require the dissipation of significant amounts of thermal energy. Process steps similar to those described in an earlier embodiment will not be described in detail.

Figure 12:
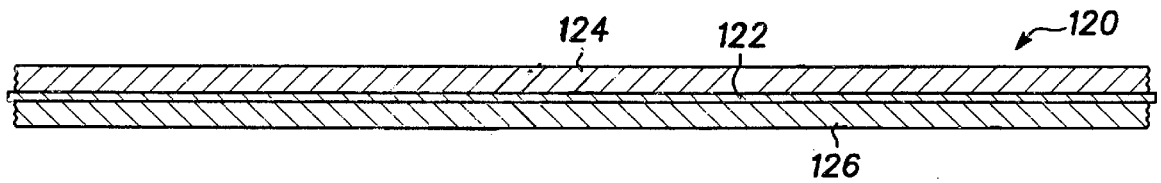
FIGS. 12–17 illustrate schematically, in cross-section, a sequence of process steps in accordance with an alternate embodiment of the invention.

As illustrated in FIG. 12, the process starts with a conductive sheet 120 that includes, in a preferred embodiment, a layer of molybdenum 122 sandwiched between an upper layer of copper 124 and a lower layer of copper 126. Other metals can be used in the sandwich structure to make up conductor sheet 120, but copper and molybdenum have been found to be advantageous because they are conducive to high thermal dissipation. One criteria for selecting the metals making up conductor sheet 120 is that the center metal 122 preferably be resistant to etchants that are used to etch layers 124 and 126.

Figure 13:
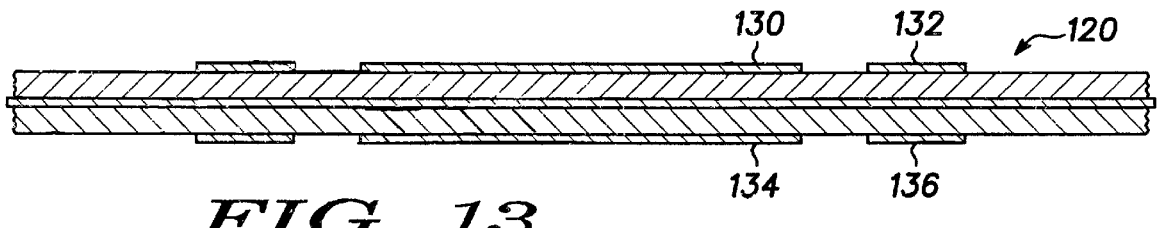

As illustrated in FIG. 13, the process continues by the selective plating of both surfaces of conductive sheet 120 with metal layers such as sequential layers of nickel and palladium. The selective plating of nickel and palladium define die attach areas 130, mold lock areas 132, die contact areas 134, and lead contact areas 136. Die attach areas 130 are preferably aligned with die contact areas 134, and mold lock areas 132 are preferably aligned with lead contact areas 136.

Figure 14:
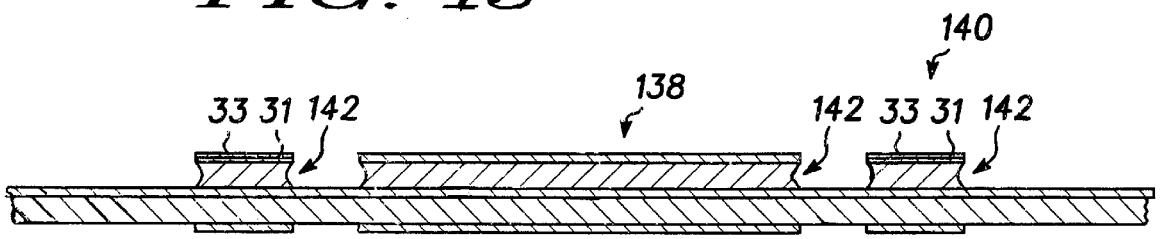

Now referring to FIG. 14, following the plating of the metal layers overlying conductive sheet 120, top layer 124 is etched using the plated metal layers on die contact areas 130 and mold lock areas 132 as etch masks. Additionally, of course, the back surface of the conductive sheet 120 should be protected during this etching step to the extent it is desired to avoid the etching of layer 126. The etching of layer 124 is continued until portions of molybdenum layer 122 are exposed, thereby forming pedestal structures. By etching to this depth, isolated die contact areas 138 and mold lock areas 140 are defined. As the etching of copper layer 124 progresses, the etchant undercuts the plated masking layers 130 and 132 forming undercut regions 142. These undercut areas will cause die bond areas 138 and mold lock areas 140 to act as mold locks when a molded resin body is subsequently formed at a later processing step. It should be noted that for larger semiconductor die, it may be desirable to adjust the thickness of molybdenum layer 122 and copper layer 124 such that the thickness of copper layer 124 should be increased in mold lock areas 132 and die attach areas 130. Accordingly, prior to selectively plating the layers of nickel and palladium onto mold lock areas 132 and die attach areas 130, copper can be selectively plated onto mold lock areas 132 and die attach areas 130 using the process described with reference to FIGS. 1–8.

Figure 15:
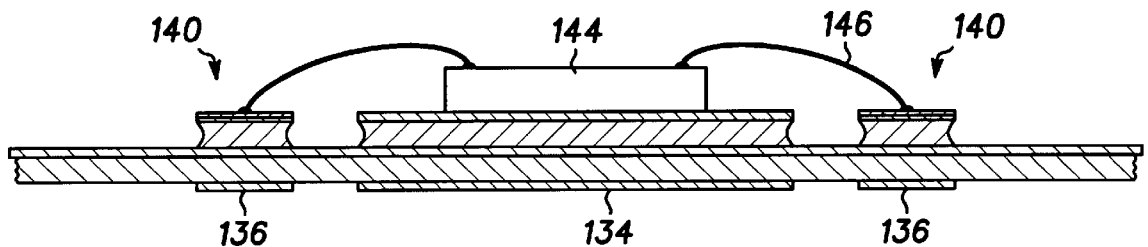

As illustrated in FIG. 15, a semiconductor device die 144 is attached to each die attach area 138. Electrical interconnects 146 are formed that extend from terminals on the top surface of semiconductor device die 144 to the associated mold lock areas 140. Interconnects 146 can be formed as previously described.

Figure 16:
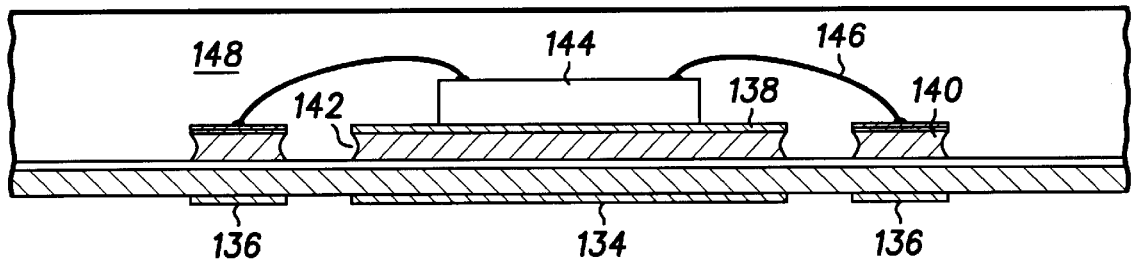

As illustrated in FIG. 16, in accordance with a preferred embodiment, a molded resin housing 148 is formed overlying a plurality of the semiconductor device die 144 and their associated interconnects. During the molding operation undercut areas 142 serve to insure that die attach areas 138 and mold lock areas 140 are securely locked into the resin housing.

Figure 17:
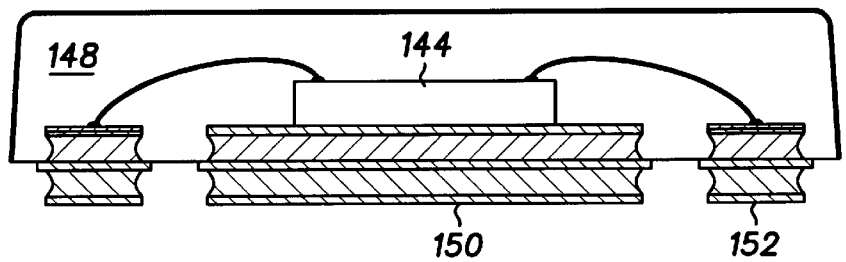

As illustrated in FIG. 17, individual and isolated die contact areas 150 and lead contact areas 152 are formed by etching through the thickness of copper layer 126 using the etch resistant plated areas 134 and 136 as etch masks. The etching is continued through the thickness of the molybdenum layer 122 to complete the electrical isolation of the various device contact areas. In this form the plurality of semiconductor devices can be electrically tested, if desired. Device fabrication can then be completed, as described earlier, by sawing through the unitary plastic housing 148 to form a plurality of individual semiconductor devices.

Semiconductor devices manufactured in this manner can be produced without the need for designing and manufacturing a custom leadframe upon which the semiconductor device die is mounted. Only two custom photolithographic masks are required so that customized device fabrication can be accomplished with short turn around time. The resulting device can be compact in size, which is advantageous for high packing density and for reduced lead inductance, and can provide good heat sinking to dissipate heat generated during device operation. Each semiconductor device die 144 is positioned on and bonded to a thick copper/molybdenum/copper heat sink which aids in the dissipation of heat.

Thus it is apparent that there has been provided, in accordance with the invention, a process for manufacturing semiconductor devices that fully meets the needs set forth above. Although the process in accordance with the invention has been described and illustrated with reference to specific illustrative embodiments thereof, it is not intended that the invention be limited to these illustrative embodiments. Those of skill in the art will recognize that various modifications and changes can be made without departing from the scope of the invention. For example, other metals can be used for the conductive sheet as well as for the materials plated onto that sheet. Additionally, different thicknesses, shapes, and layouts can be used to implement specific device types.

Accordingly, it is intended to include within the invention all such variations and modifications as fall within the scope of the appended claims.

What is claimed is:

1. A process for manufacturing a semiconductor device comprising the steps of:
   providing a sheet of conductive material having first and second surfaces and a thickness;
   selectively applying an etch resistant material to the second surface of the sheet;
   forming a mold lock extending upwardly from the first surface of the sheet wherein the mold lock does not form a recess within the first surface of the sheet;
   attaching a semiconductor die to the first surface of the sheet;
   forming an electrical connection from the semiconductor die to the mold lock;
   providing an encapsulating resin overlying the first surface of the sheet to encapsulate the mold lock, semiconductor die and electrical connection; and
   selectively etching through the thickness of the sheet from the second surface using the etch resistant material as an etch mask to expose the encapsulating resin.

2. The process of claim 1 wherein the step of providing the sheet of conductive material comprises providing a copper sheet.

3. The process of claim 1 wherein the step of forming the mold lock comprises the steps of:
   forming a patterned plating mask on the first surface of the sheet of conductive material;
   plating portions of the sheet of conductive material exposed through openings in the patterned plating mask with copper; and
   removing the patterned plating mask.

4. The process of claim 1 wherein the step of selectively applying comprises the steps of:
   applying a layer of photo-imageable resist to the second surface;
   patterning the layer of photo-imageable resist to form openings therethrough exposing portions of the second surface; and
   plating portions of the second surface exposed through the openings with layers of nickel and palladium.

5. The process of claim 1 wherein the step of selectively applying comprises the step of selectively plating the second surface with sequential layers of nickel and gold.

6. The process of claim 1 further comprising the step of applying a layer of conductive material to the first surface of the sheet to form a die attach area.

7. The process of claim 1 wherein the step of providing the conductive material comprises the step of providing a layer of molybdenum sandwiched between first and second layers of copper.

8. The process of claim 7 wherein the step of forming the mold lock includes selectively etching the first layer of copper to form a pedestal structure having a surface.

9. The process of claim 7 wherein the step of forming the mold lock includes using the layer of molydenum as an etch stop material.

10. The process of claim 7 further including the step of selectively plating the conductive material on the surface of a pedestal structure.

11. The process of claim 10 wherein the step of selectively plating includes plating a layer of nickel over the surface of the pedestal structure.

12. The process of claim 11 wherein the step of selectively plating further includes plating palladium over the layer of nickel.

13. The process of claim 10 wherein the step of selectively plating includes plating a layer of copper on the surface of the pedestal.

14. The process of claim 13 wherein the step of selectively plating includes plating another conductive material on the layer of copper plated on the pedestal structure.

15. The process of claim 1 wherein the step of selectively applying comprises the steps of:
   applying a layer of photo-imageable resist to the first surface;
   patterning the layer of photo-imageable resist to form openings therethrough exposing portions of the first surface; and
   plating portions of the first surface exposed through the openings with layers of nickel and palladium.

16. The process of claim 1 wherein the step of selectively applying comprises the step of selectively plating the first surface with sequential layers of nickel and gold.

17. A process for manufacturing a plurality of semiconductor devices comprising the steps of:
   providing a sheet of a first conductive material having first and second sides;
   selectively plating the first side of the sheet with a second conductive material to form a plurality of die attach areas;
   selectively plating the second side of the sheet with a third etch resistant conductive material to define a plurality of device lead contacts and a plurality of device die contacts, the device die contacts being defined in alignment with the die attach areas;
   selectively plating the first side of the sheet with a fourth conductive material to form a plurality of mold locks in alignment with the plurality of device lead contacts;
   attaching a semiconductor die to each of the plurality of die attach areas;
   forming an electrical interconnect extending from each of the semiconductor die to an associated one of the mold locks;
   encapsulating all of the semiconductor die and the electrical interconnects in a unitary molded resin housing;
   selectively etching through the sheet from the second side using the third etch resistant conductive material as an etch mask to form a plurality of isolated device lead contacts and a plurality of isolated device die contacts; and
   sawing through the unitary molded resin housing to separate the plurality of semiconductor die into a plurality of individual device structures.

18. The process of claim 17 wherein the step of providing a sheet of conductive material comprises the step of providing a sheet of copper having a size and shape independent of the type of semiconductor die attached thereto.

19. The process of claim 17 wherein the step of providing the sheet of conductive material comprises the step of providing a layer of molybdenum sandwiched between two layers of copper.

20. The process of claim 17 wherein the step of selectively plating the first side of the sheet with a fourth conductive material to form a plurality of mold locks further comprises forming at least one of the mold locks in contact with a die attach area.

21. The process of claim 20 further comprising the step of attaching an electrical interconnection between the semiconductor die attached to a die attach area and the mold lock in contact with that die attach area.

22. The process of claim 17 wherein the step of attaching a semiconductor die comprises attaching at least two semiconductor die to each of the plurality of die attach areas.

23. The process of claim 17 wherein the step of encapsulating comprises the steps of:

placing the sheet of a first conductive material having semiconductor die attached thereto in a mold cavity, the mold cavity being independent of the type of semiconductor die attached to the sheet; and filling the mold cavity with a resin material to form the unitary molded resin housing overlying the first side of the sheet of the first conductive material.

24. The process of claim 17 further comprising the step of electrically testing each of the semiconductor die after the step of selectively etching but before the step of sawing.

25. A process for manufacturing a plurality of semiconductor devices comprising the steps of:

providing a conductive sheet of material;

defining a plurality of die attach areas and a plurality of interconnect bond areas on a first surface of the conductive sheet;

attaching a plurality of semiconductor device die to the die attach areas; providing an interconnection between each of the semiconductor device die and an associated one of the interconnect bond areas;

encapsulating the plurality of semiconductor device die in a unitary resin housing;

selectively etching the conductive sheet to remove first portions of the conductive sheet, leaving second portions of the conductive sheet coupled to the die attach areas and the interconnect bond areas; and sawing through the unitary resin housing to singulate the semiconductor device die.

26. The process of claim 25 wherein the step of defining a plurality of interconnect bond areas comprises the steps of:

forming a plating mask layer having a plurality of openings therethrough on the first surface of the conductive sheet, the plurality of openings exposing regions of the first surface of the conductive sheet; and plating the exposed regions with copper to form a plurality of mold locks extending above the surface of the conductive sheet, each of the mold locks having an upper surface forming an interconnect bond area.

27. The process of claim 25 wherein the step of selectively etching comprises the steps of:

applying a patterned etch mask to a second surface of the conductive sheet, the patterned etch mask comprising a plurality of masks in alignment with the plurality of die attach areas and the plurality of interconnect bond areas; and etching portions of the second surface of the conductive sheet that are not covered by the plurality of masks.

28. A process for manufacturing a plurality of semiconductor devices comprising the steps of:

providing a sheet comprising copper, the sheet having first and second surfaces; selectively plating the first surface of the sheet to form a plurality of die attach areas;

selectively plating the second surface of the sheet with a conductive etch resistant material to define a plurality of die contact areas and a plurality of bond contact areas, the die contact areas in alignment with the die attach areas;

selectively plating the first surface of the sheet with copper to form a plurality of mold locks, each of the mold locks aligned to respective ones of the plurality of bond contact areas and each of the mold locks having a bonding surface;

attaching a semiconductor die to each of the plurality of die attach areas; providing an electrical interconnection between each of the semiconductor die and an associated one of the bonding surfaces;

forming a unitary resin housing encapsulating all of the semiconductor die;

etching the second surface of the sheet using the etch resistant conductive material as an etch mask to separate the sheet into a plurality of electrically isolated die contact areas and a plurality of bond contact areas; and sawing through the unitary resin housing to singulate the semiconductor die into a plurality of semiconductor devices.

29. The process of claim 28 further comprising the step of electrically testing the semiconductor die after the step of etching the second surface and before the step of sawing.

30. The process of claim 28 wherein the step of selectively plating the second surface comprises selectively plating the second surface with sequential layers of nickel and palladium.

* * * * *